United States Patent [19]

Mostert et al.

[11] 4,250,485
[45] Feb. 10, 1981

[54] MONITORING THE OPERATION OF A VEHICLE

[75] Inventors: Jacob J. Mostert, Muldersdrift; Henning M. Henderson, Johannesburg, both of South Africa

[73] Assignee: Kiloking (Proprietary) Limited, South Africa

[21] Appl. No.: 934,561

[22] Filed: Aug. 17, 1978

[30] Foreign Application Priority Data

| Aug. 17, 1977 | [ZA] | South Africa | 77/4986 |
| Nov. 11, 1977 | [ZA] | South Africa | 77/6761 |
| Feb. 21, 1978 | [ZA] | South Africa | 78/1022 |

[51] Int. Cl.³ .................... B60Q 5/00; G08B 21/00
[52] U.S. Cl. .................... 340/52 R; 180/171; 340/62; 340/670; 346/18
[58] Field of Search .............. 340/52 R, 62, 60, 669, 340/670; 346/18; 180/103 R, 103 BF, 105 E, 171, 282

[56] References Cited

U.S. PATENT DOCUMENTS

| 2,738,404 | 3/1956 | Fitzsimmons | 340/60 X |
| 2,870,753 | 1/1959 | Shuck et al. | 340/60 X |
| 2,914,960 | 12/1959 | Edgerton | 180/171 X |
| 3,004,818 | 10/1961 | Delfs et al. | 346/18 X |
| 3,035,133 | 5/1962 | Greenberg | 200/61.89 |
| 3,206,116 | 9/1965 | Short | 346/18 X |
| 3,635,101 | 1/1972 | Hsian | 74/526 |
| 3,793,622 | 2/1974 | Hida et al. | 340/62 |
| 3,863,205 | 1/1975 | Chun-Chih | 340/32 |
| 3,925,753 | 12/1975 | Auman et al. | 340/62 X |
| 4,065,961 | 1/1978 | Crew | 340/60 X |
| 4,093,939 | 6/1978 | Mitchell | 340/62 X |

FOREIGN PATENT DOCUMENTS

| 56954 | 1/1971 | Australia . |
| 337017 | 10/1977 | Austria . |
| 743034 | 7/1974 | South Africa . |
| 666673 | 6/1975 | South Africa . |
| 760973 | 1/1976 | South Africa . |

*Primary Examiner*—John W. Caldwell, Sr.
*Assistant Examiner*—Joseph E. Nowicki
*Attorney, Agent, or Firm*—Karl W. Flocks

[57] ABSTRACT

A method of and apparatus for monitoring the operation of a motor vehicle subjected to a decelerative force, wherein the vehicle's throttle opening is sensed, an indication is given when the throttle opening exceeds a predetermined value, wherein the decelerative force is sensed, and wherein the predetermined value is varied automatically as the decelerative force on the vehicle varies. If the throttle opening continues to exceed the predetermined value, then a recording is made.

10 Claims, 4 Drawing Figures

MONITORING THE OPERATION OF A VEHICLE

This invention relates to the monitoring of the operation of a motor vehicle.

The applicants have found that bad driving habits of drivers result in heavy financial losses by fleet owners of vehicles and others. Such losses can result from excessive fuel consumption and wear and tear generally but particularly on tires, brakes, clutches, and the like.

Applicants are aware of a system in which accelerative, decelerative and/or centrifugal forces on a vehicle in a plane parallel to the surface on which the vehicle is supported are sensed and in which a warning is issued and/or unit counts are recorded when these forces exceed a predetermined value. However, fuel wastage may occur even though the vehicle is not accelerating beyond the predetermined degree. This may, for example, happen when the engine is running at low speed and the accelerator pedal is depressed hard. Because of the inefficiency of the engine under these conditions, fuel is heavily wasted. Another disadvantage of this system is that it becomes more sensitive when the vehicle is inclined with respect to the horizontal, so that an unfair indication is given of a driver's driving performance when travelling over hilly terrain, going up or down ramps, and so on.

Applicants are also aware of a system whereby an electrical switch is closed when the accelerator pedal of a vehicle is depressed beyond a certain point, resulting in the energisation of a blinking light or a buzzer and thereby warning the driver of the vehicle that he is indulging in an excess. In this system no recording is made of such excesses so that others cannot later access the driver's performance. Another disadvantage of this system is that no allowance is made for the fact that more fuel is required when travelling uphill than when travelling downhill or along a level road.

It is an object of the present invention to overcome the above and other disadvantages which will become apparent later on in the present specification.

According to the invention there is provided a method a monitoring the operation of a motor vehicle, which method comprises:

sensing the vehicle's throttle opening;

sensing a parameter which corresponds to the magnitude of a variable load force acting on the vehicle in a direction opposite to the direction of forward travel of the vehicle; and giving an indication when the throttle opening exceeds a predetermined throttle opening value, the predetermined throttle opening value being a varying function of said parameter.

The term "throttle opening" in the specification means the setting or position of the fuel supply mechanism of the vehicle, which is operative to admit fuel, air, or a fuel/air mixture to the engine in varying degrees, the setting or position corresponding to a particular degree of fuel, air, or fuel/air mixture supply to the engine.

The parameter may be the angle of inclination of the vehicle to the horizontal in the direction of forward travel of the vehicle, said load force being gravitational.

The predetermined throttle opening value may be provided as a varying function of said parameter by inhibiting giving of said indication if said parameter corresponds to a load force which exceeds a predetermined load force value.

The giving of said indication may comprise issuing a warning signal to the driver of the vehicle.

Alternatively, or in addition, the giving of said indication may comprise making a recording.

The giving of said indication may comprise issuing a warning signal to the driver and then, a predetermined time thereafter, if the throttle opening has not by then reduced to below said predetermined throttle opening value, making a recording.

The invention extends to a method of monitoring the operation of a motor vehicle, which comprises:

sensing the vehicle's throttle opening; and making a recording when the throttle opening exceeds a predetermined value, the recording being representative of the length of time for which the throttle opening has exceeded said predetermined value.

The making of said recording may comprise recording unit counts at spaced intervals of time while the throttle opening exceeds said predetermined value.

Further according to the invention there is provided apparatus for monitoring the operation of a motor vehicle, which apparatus comprises:

first sensing means for sensing the vehicle's throttle opening;

second sensing means for sensing a parameter which corresponds to a variable load force acting on the vehicle in a direction opposite to the direction of forward travel of the vehicle; and indicating means operative in response to the first sensing means and the second sensing means to give an indication when the throttle opening exceeds a predetermined throttle opening value, the predetermined throttle opening value being a varying function of said parameter.

Said parameter may be the angle of inclination of the vehicle to the horizontal in the direction of forward travel of the vehicle, said load force being gravitational.

The first sensing means may be in the form of first switching means adapted to be switched when the throttle opening exceeds a fixed predetermined throttle opening value, and the second sensing means may be in the form of second switching means adapted to be switched when said angle of inclination exceeds a predetermined angle value, the arrangement being such that, when both the first switching means and the second switching means are switched, the indicating means is operative to give said indication, whereas, when either one of the switching means is not switched, the indicating means is inhibited, thereby providing said predetermined throttle opening value as a varying function of said angle of inclination.

The invention extends to apparatus for monitoring the operation of a motor vehicle, which apparatus comprises:

sensing means for sensing the vehicle's throttle opening; and recording means operative in response to the sensing means to make a recording when the throttle opening exceeds a predetermined value, the recording being representative of the length of time for which the throttle opening has exceeded said predetermined value.

The invention will now be described in more detail, by way of example, with reference to the accompanying drawings.

In the drawings

Figure 1:
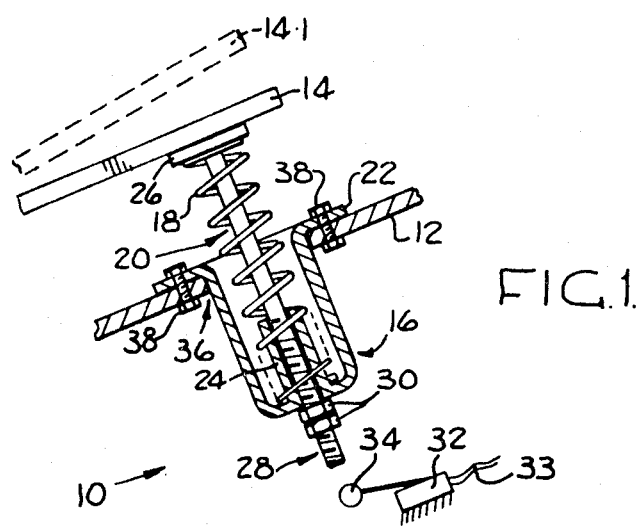
FIG. 1 is a cross-section through the floor-board of a motor vehicle, showing the arrangement of a switching device for sensing excessive throttle openings.

Referring now to FIG. 1, reference numeral 10 generally indicates a switching arrangement for sensing excessive throttle openings. In this Figure, the floor board of the vehicle is indicated by reference numeral 12 and its accelerator pedal by reference numeral 14.

The arrangement 10 comprises a cup-shaped body 16, a coil spring 18, and a plunger 20. At its rim, the body 16 has a radially outwardly extending flange 22, and at its bottom it has a sleeve-like guide 24 in which the plunger fits slidably, to extend through the bottom of the body 16. The plunger has a disc-shaped head 26 at one end and is screw-threaded at the other end as indicated by reference numeral 28. The spring 18 extends between the head 26 and the bottom of the body 16. On the screw-threaded end 28 of the plunger there are provided two nuts 30, one of which acts in use as a lock nut.

Below the body 16 there is mounted a micro switch 32 (herein also referred to as the accelerator switch) having electrical connections 33 and the actuator arm 34 of which is arranged such that the switch is actuated when the pedal 14 is depressed further than a predetermined distance.

In order to mount the device 10 in a motor vehicle, an opening 36 is cut in the floor board 12 below the accelerator pedal 14 and the body 16 secured in position to extend with its bottom through the opening thus cut out. The flange 22 will then seat against the inside surface of the floor board. The device is secured in position by means of bolts 38.

In order to adjust the position at which the spring 18 comes into operation, the nuts 30 may be adjusted along the screw-threaded end 28 of the plunger and locked into the desired position.

In operation, when the accelerator pedal 14 is depressed from its rest position as indicated by dotted lines at 14.1, it will travel against its normal bias until it abuts against the head 26. When the accelerator pedal is depressed further, additional force has to be applied in order also to depress the plunger 20 against the spring 18.

The switch 32 may be adjustably mounted so as to permit adjustment of the extent of pedal depression at which it will be actuated.

Figure 2:
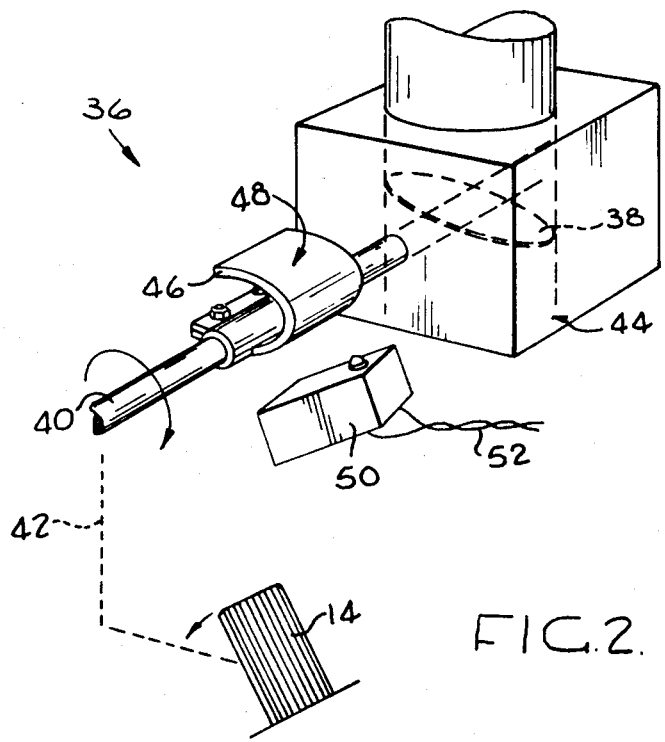
FIG. 2 is a diagrammatic perspective view of a motor vehicle's carburettor, showing a first alternative arrangement of a switching device for sensing excessive throttle openings.

Referring now to FIG. 2, reference numeral 36 generally indicates the throttle mechanism of a vehicle's engine. The throttle mechanism comprises an accelerator pedal 14, a butterfly valve 38, a butterfly valve spindle 40 on which the butterfly valve 38 is mounted, and a linkage 42 (shown schematically in dotted lines) interconnecting the spindle 40 and the accelerator pedal 14. The butterfly valve 38 forms part of throttling means 44 operable to admit air or an airfuel mixture into the intake manifold of the engine of the vehicle in varying degrees.

On the spindle 40 there is mounted a cam 46 having a cam surface 48. Adjacent the cam 46 there is mounted in fixed relationship to the throttling means 44, a microswitch 50 (herein also referred to as the accelerator switch) which can be actuated by the cam 46. Electrical connections 52 lead from the switch 50 to the rest of the circuitry of the device.

In operation, if the accelerator pedal 14 is depressed beyond a certain point, the cam 46 will engage with the micro-switch 50, causing its contacts to close. The cam 46 is of a resilient material so that pedal depression beyond this point will be permitted. The point at which the switch 50 is engaged may be adjusted by adjusting the angular position of the cam 46 on the spindle 40.

Figure 3:
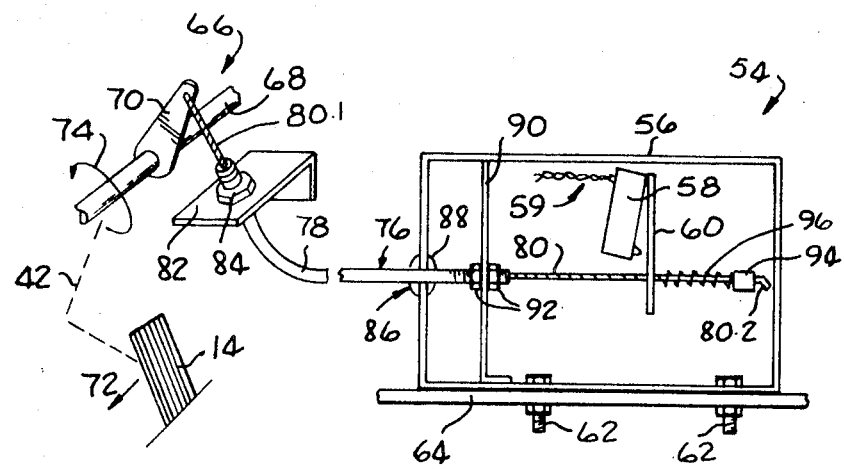
FIG. 3 is a diagrammatic perspective view of a motor vehicle's throttle linkage, showing a second alternative arrangement of a switching device for sensing excessive throttle openings.

Referring now to FIG. 3, reference numeral 54 generally indicates a switching arrangement having a housing or box 56 within which there is mounted a microswitch 58 having electrical connections 59, and an operating arm 60. The box 56 is mounted by means of mounting screws 62 on a support bracket 64 located in a convenient position in the vehicle, eg below or behind the vehicle's dashboard.

The vehicle has a throttle mechanism 66 which includes a pivotally displaceable throttle spindle 68 fast with a butterfly valve (not shown) for controlling the flow of fuel/air mixture to the vehicle's engine, a radius arm 70 fast with the throttle spindle, an accelerator pedal 14, and a connecting linkage 42 (shown schematically in dotted lines) operatively connecting the accelerator pedal 14 to the throttle spindle 68. The arrangement is such that depression of the accelerator pedal 14 in the direction of arrow 72 causes pivotal displacement of the throttle spindle 68 in the direction of arrow 74, thereby permitting fuel/air mixture to be drawn into the vehicle's engine at an increased rate.

The throttle mechanism 66 is connected to the operating arm 60 of the microswitch 58 by means of a sheathed cable 76 having a sheath 78 and a cable 80 displaceable in to and fro fashion within the sheath. The sheath 78 is screw threaded at its two ends and is anchored at its end near the throttle mechanism 66 to a bracket 82. The bracket 82 is fast with the body of the vehicle and anchoring is effected by means of two nuts 84 (only one of which is visible) screwed on the screw-threaded end of the sheath. The sheathed cable 76 passes through an opening 86 in the wall of the box 56. The opening 86 is provided with a grommet 88. At its other end the sheath 78 is anchored to an internal wall 90 of the box 56 by means of two nuts 92. One end 80.1 of the cable 80 is attached to the free end of the radius arm 70, and the other end 80.2 passes slidably through an opening (not shown) in the operating arm 60 of the microswitch 58. On the end 80.2 of the cable there is crimped a stop 94. On the cable 80, between the stop 94 and the operating arm 60, there is arranged a coil spring 96.

In operation, if the accelerator pedal 14 is depressed in the direction 72, the cable 80 will slide along the sheath 78 from right to left. If the pedal is depressed beyond a predetermined point, the coil spring 96 will abut against the arm 60 and against the stop 94 and cause operation of the microswitch 58.

The throttle opening at which the switch 58 is switched may be adjusted by adjusting the mountings of the sheath 78 on the bracket 82 or on the internal wall 90, by adjusting the position of the switch 58 in the box 56, or by adjusting the position of the stop 94 on the cable 80. In order to render the system tamper-proof, the nuts 84 may be locked eg by spot-welding, so that the mounting on the bracket 82 cannot be adjusted. Also, the end 80.1 of the cable may be secured to the radius arm 70 by means of, for example, a lead seal (not shown). Adjustments can then only be made within the box 56 by adjusting either the nuts 92, the position of the switch 58, or the position of the stop 94 on the cable 80. The box 56 may have a key-operated lid by means of which it can be locked in the closed position, thereby preventing unauthorised access to the interior of the box.

Figure 4:
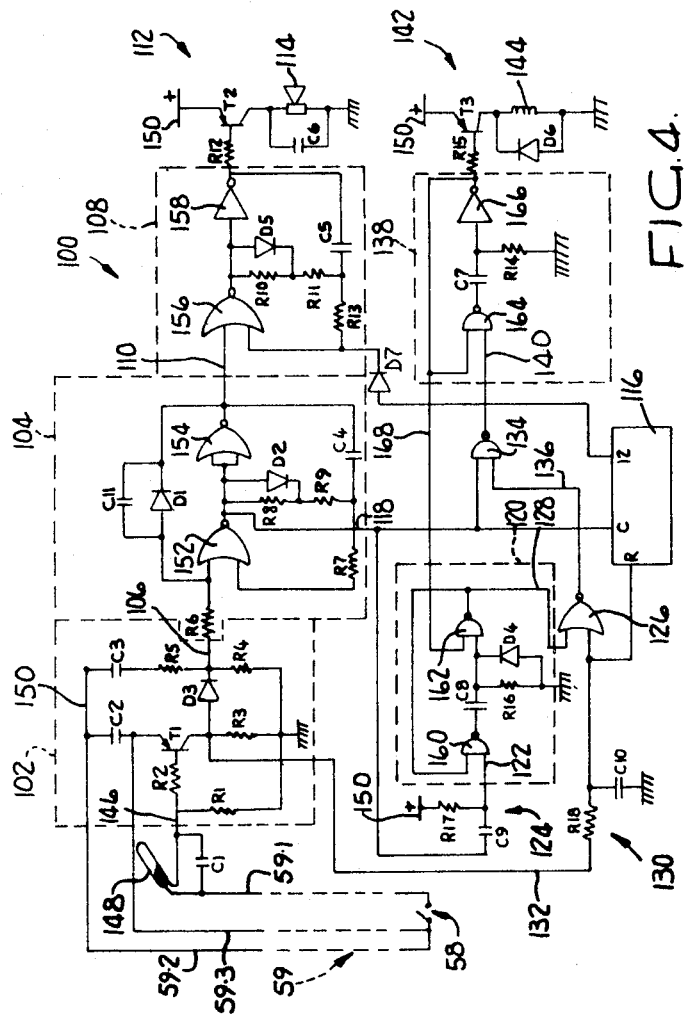
FIG. 4 is a circuit diagram of a monitoring device for monitoring excessive throttle openings and making use of any one of the switching devices shown in FIGS. 1 to 3.

Referring now to FIG. 4, reference numeral 100 indicates the electrical circuit diagram of a monitoring device of which any one of the accelerator switches 32, 50 and 58 of FIGS. 1 to 3 forms part. In FIG. 4 the accelerator switch is indicated by reference numeral 58. The monitoring device comprises: a switching circuit 102; an a-stable circuit 104 connected to the switching circuit 102 via a connection 106; a tone generator 108 connected to the a-stable circuit 104 via a connection 110; an output stage 112 connected to the output of the tone generator 108 via a resistor R12 and comprising a switching transistor T2, a loudspeaker 114, and a capacitor C6 connected across the loudspeaker; a first timing circuit 116, the input of which is connected to the a-stable circuit 104 via a connection 118, and the output of which is connected via a gating diode D7 to the tone generator 108; a second timing circuit 120 which has its input 122 connected to the a-stable circuit 104 via an RC differentiator circuit 124 and the connection 118; a NOR-gate 126 having its one input connected to the output 128 of the second timing circuit 120 and its other input connected to the switching circuit 102 via an RC integrator circuit 130 and a connection 132; a NAND gate 134 having one of its inputs connected to the output of the NOR gate 126 via a connection 136 and its other input connected to the a-stable circuit 104 via the connection 118; a counter pulse generating circuit 138 which has its trigger input connected to the output of the NAND gate 134 via a connection 140; and an output stage 142 connected to the output of the pulse generating circuit 138 via a resistor R15, and comprising a switching transistor T3, a coil 144 of a counter relay, and a free-wheeling diode D6 connected across the coil 144.

As will further be seen in FIG. 4, one pole of the accelerator switch 58 is connected to an input 146 of the switching circuit 102 via a conductor 59.1 of the connection 59, and an angle sensitive mercury switch 148. The mercury switch 148 is mounted on the vehicle's chassis such that its contacts are normally closed, but open when the vehicle is inclined at more than a predetermined angle to the horizontal. A capacitor C1 is connected across the terminals of the mercury switch 148 to eliminate the effect of splashing of the mercury in the switch under rough road conditions. The other pole of the accelerator switch 58 is connected to a positive supply rail 150 in the device 100 via a conductor 59.2 of the connection 59. A further conductor 59.3 is connected from said other pole of the accelerator switch 58 to the emitter of a transistor T1 in the switching circuit 102, a capacitor C2 being connected between the emitter and the positive rail 150.

The switching circuit 102 further comprises a capacitor C3, resistors R1, R2, R3, R4 and R5, and a diode D3 which, as is shown in the drawings, are connected in such a manner that, when the accelerator switch 58 is open (ie under normal conditions) then the transistor T1 is switched on and the voltage on the output 106 high. When the switch 58 is closed (ie when the driver indulges in an excess by depressing the accelerator pedal 14 beyond a predetermined position) the transistor T1 switches off and the voltage on the output 106 drops to a low value after a short time delay which depends on the values of C3, R5 and R4.

The astable circuit 104 comprises a pair of NOR gates 152 and 154, capacitors C4 and C11, resistors R6, R7, R8 and R9, and diodes D1 and D2, which, as shown in the drawings, are connected to form an astable multivibrator circuit having an 'off' time of about 0.5 seconds an an 'on' time of about 1.5 seconds. Its frequency is thus about 2 seconds. Operation of the astable circuit 104 is initiated as soon as the voltage on the connection 106 drops to a low value, and is inhibited when the voltage on the connection 106 is at a high value.

The tone generator 108 comprises a NOR gate 156 and an inverter 158, a capacitor C5, resistors R10, R11, and R13, and a diode D5, connected as shown in the drawings to form an astable multivibrator having a frequency of about 400 Hz and a mark to space ratio of 7 to 1. The connection 110 is connected to one of the inputs of the NOR gate 156 and the diode D7 is connected to the other input thereof. When either one of the inputs of the NOR gate 156 is kept high, oscillation of the tone generator will be inhibited.

The first timing circuit 116 is in the form of a 12 bit counter having its input or counter terminal C connected via the connection 118 to the output of the NOR gate 152 in the astable circuit 104 and having its last output stage '12' connected via the gating diode D7 to one of the inputs of the NOR gate 156 in the tone generator 108. Its reset terminal R is connected via the RC integrator 130 and the connection 132 to the collector of the transistor T1 in the switching circuit 102.

The second timing circuit 120 comprises a pair of NAND gates 160 and 162, a capacitor C8, a resistor R16, and a diode D4, which are connected as shown in the drawings to form a monostable multivibrator being stable in the 'on' state and having an 'off' time of about 2 seconds or longer.

The RC differentiator 124 comprises a capacitor C9, and a resistor R17 tied to the positive rail 150.

The RC integrator 130 comprises a resistor R18, and a capacitor C10 tied to ground.

The counting pulse generator 138 comprises a NAND gate 164, an inverter 166, a capacitor C7, and a resistor R14, connected as shown in the drawings to form a monostable multivibrator being stable in the 'on' state and having an 'off' time of about 50 milliseconds.

During normal driving conditions, the accelerator switch 58 will be open so that the transistor T1 is switched on and oscillation of the astable circuit 104 is inhibited. Thus, the output voltage on the connection 110 will be high so that oscillation of the tone generator 108 will also be inhibited. The output voltage of the NOR gate 152 will be low and the first timing circuit 116 in its reset condition.

When the driver indulges in an excess by depressing the accelerator pedal 14 down beyond a predetermined position the accelerator switch 58 will close and, provided the angle sensitive switch 148 is also closed, the transistor T1 will switch off, thereby enabling the astable circuit 104. Thus the output of the NOR gate 152 will go high for 0.5 seconds and the output of NOR gate 154 will go low for 0.5 seconds. This will be repeated every 2 seconds for as long as the accelerator pedal is kept down.

For each 0.5 second 'off' pulse on the output of NOR gate 154, the tone generator 108 will be enabled, thus giving a 0.5 second acoustic bleep which will warn the driver that he is depressing his accelerator pedal too far.

At the end of each bleep, ie when the output of NOR gate 152 switches from high to low, a low going pulse will be provided by the differentiator circuit 124 to the second timing circuit 120, causing the output voltage on connection 128 to go from high to low. With the accelerator pedal in the depressed condition, the voltage at the output of the integrator circuit 130 will also be low so that the output of NOR gate 126 will go high as soon as the voltage on the connection 128 goes low. This enables the NAND gate 134 via the connection 136, which means that, as soon as the output of the NOR gate 152 switches high again at the start of the next warning bleep, the output 140 of the NAND gate 134 will go high, triggering the count pulse generator 138. This will cause a count pulse to be fed to the count relay coil 144, which will cause the relay to record a count. At the same time the second timing circuit 120 will be reset via a connection 168 which leads from the output of the inverter 166 to one of the inputs of the NAND gate 162.

This process will continue for as long as the accelerator pedal 14 is kept down, so that a count is recorded at the start of each warning bleep except the first one.

For each bleep a pulse will be fed to the counter input C of the first timing circuit 116. After 512 counts (about 15 minutes) the last stage of the counter will go high. This will inhibit the tone generator 108 via the gating diode D7 so that the bleeping stops. The counter will nevertheless continue recording a count every 2 seconds. The purpose of the first timing circuit is to stop the bleeping in case of a faulty circuit or switch 58. The driver of the vehicle will in such a case, however, have to account for a faulty circuit or switch because his counter will show a very high count.

If the pedal 14 is released within two seconds from the occurrence of a bleep, the voltage on the connection 136 will go low again before the voltage on the connection 118 goes high for the second time so that no count will be recorded for that particular bleep.

Also, if the pedal 14 is released, a reset pulse will, after a short time delay which will depend on the values of R18 and C10, be fed to the reset terminal R of the first counter 116. Accordingly, if the pedal is released at any time during the fifteen minute period referred to above, or thereafter, and there is no fault in the circuit or the switch 58, the circuit 116 will be reset so that bleeping will again occur for a full fifteen minutes if the pedal is again kept depressed for a long period of time.

The angle sensitive switch 148 will open to prevent operation of the monitoring device when the vehicle in which the device is mounted is climbing a hill which is steeper than a predetermined degree. This is particularly useful in the case of transport vehicles where it is necessary to apply full throttle in order to climb steep inclines.

The connection 59 is arranged so that its end connections are not visible and the conductors 59.1, 59.2 and 59.3 will all have identically coloured insulation. If the device is tampered with by short circuiting the conductor 59.1 to any one of the conductors 59.2 or 59.3, or by cutting any one of the conductors 59.2 or 59.3, the device will start bleeping. Sabotaging of the device will only be successful if the conductor 59.1, and only that conductor, is cut. This will make successful sabotaging of the device very difficult.

What we claim is:

1. A method of monitoring the operation of a motor vehicle, which method comprises:
   sensing the vehicle's throttle opening;
   sensing a parameter which corresponds to the magnitude of a variable load force acting on the vehicle in a direction opposite to the direction of forward travel of the vehicle; and
   giving an indication when the throttle opening exceeds a predetermined throttle opening value, the predetermined throttle opening value being a varying function of said parameter.

2. A method as claimed in claim 1, wherein said parameter is the angle of inclination of the vehicle to the horizontal in the direction of forward travel of the vehicle, said load force being gravitational.

3. A method as claimed in claim 1 or claim 2, wherein said predetermined throttle opening value is provided as a varying function of said parameter by inhibiting giving of said indication if said parameter corresponds to a load force which exceeds a predetermined load force value.

4. A method as claimed in claim 1 or claim 2, wherein giving said indication comprises issuing a warning signal to the driver of the vehicle.

5. A method as claimed in claim 1, wherein giving said indication comprises making a recording.

6. A method as claimed in claim 1, wherein giving said indication comprises issuing a warning signal to the driver and then, a predetermined time thereafter, if the throttle opening has not be then been reduced to below said predetermined throttle opening value, making a recording.

7. A method as claimed in claim 5, or 6, wherein making of said recording comprises recording unit counts at spaced intervals of time while the throttle opening exceeds said predetermined value.

8. Apparatus for monitoring the operation of a motor vehicle, which apparatus comprises:
   first sensing means for sensing the vehicle's throttle opening;
   second sensing means for sensing a parameter which corresponds to a variable load force acting on the vehicle in a direction opposite to the direction of forward travel of the vehicle; and
   indicating means operative in response to the first sensing means and the second sensing means to give an indication when the throttle opening exceeds a predetermined throttle opening value, the predetermined throttle opening value being a varying function of said parameter.

9. Apparatus as claimed in claim 8, wherein said parameter is the angle of inclination of the vehicle to the horizontal in the direction of forward travel of the vehicle, said load force being gravitational.

10. Apparatus as claimed in claim 9, wherein the first sensing means is in the form of first switching means adapted to be switched when the throttle opening exceeds a fixed predetermined throttle opening value, and wherein the second sensing means is in the form of second switching means adapted to be switched when said angle of inclination exceeds a predetermined angle value, the arrangement being such that, when both the first switching means and the second switching means are switched, the indicating means is operative to give said indication, whereas, when either one of the switching means is not switched, the indicating means is inhibited, thereby providing said predetermined throttle opening value as a varying function of said angle of inclination.

* * * * *